United States Patent
Leem

(10) Patent No.: US 9,564,943 B2
(45) Date of Patent: Feb. 7, 2017

(54) CASE APPARATUS

(71) Applicant: LG INNOTEK CO., LTD., Seoul (KR)

(72) Inventor: Sung Hyun Leem, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/698,446

(22) Filed: Apr. 28, 2015

(65) Prior Publication Data

US 2015/0311942 A1 Oct. 29, 2015

(30) Foreign Application Priority Data

Apr. 29, 2014 (KR) .................. 10-2014-0051883

(51) Int. Cl.
| | |
|---|---|
| H04B 5/00 | (2006.01) |
| H04B 1/3888 | (2015.01) |
| H01L 23/28 | (2006.01) |
| H01Q 1/24 | (2006.01) |
| H01Q 1/52 | (2006.01) |
| H01Q 7/00 | (2006.01) |
| H01Q 21/28 | (2006.01) |

(52) U.S. Cl.
CPC ............ H04B 1/3888 (2013.01); H01L 23/28 (2013.01); H01Q 1/243 (2013.01); H01Q 1/526 (2013.01); H01Q 7/00 (2013.01); H01Q 21/28 (2013.01); H04B 5/0031 (2013.01); H01L 2924/0002 (2013.01)

(58) Field of Classification Search
CPC ..... H04B 1/3888; H04B 5/0031; H01Q 1/526; H01Q 7/00; H01Q 23/28; H01Q 1/243; H01Q 21/28

USPC .............. 455/41.1, 90.3, 550.1, 575.8, 575.5,455/575.1, 575.7
See application file for complete search history.

(56) References Cited

U.S. PATENT DOCUMENTS

| | | | | |
|---|---|---|---|---|
| 7,333,786 | B2 * | 2/2008 | Kikuchi | G06K 7/0008 340/10.1 |
| 8,208,980 | B2 * | 6/2012 | Wong | H01Q 1/243 343/702 |
| 8,364,203 | B2 | 1/2013 | Morel et al. | |
| 8,406,686 | B2 | 3/2013 | Tsushima et al. | |
| 8,736,495 | B2 * | 5/2014 | Cho | G06K 19/0723 343/702 |

(Continued)

FOREIGN PATENT DOCUMENTS

| | | |
|---|---|---|
| CN | 1604117 A | 4/2005 |
| CN | 1905272 A | 1/2007 |

(Continued)

OTHER PUBLICATIONS

Decision of Grant dated Jun. 28, 2011 in Korean Application No. 10-2009-0051475, filed Jun. 10, 2009.

(Continued)

*Primary Examiner* — Marceau Milord
(74) *Attorney, Agent, or Firm* — Saliwanchik, Lloyd & Eisenschenk

(57) ABSTRACT

The embodiment relates to a case apparatus including antenna elements, a shielding member interposed between the antenna elements and a protective part to encapsulate and couple the antenna elements and the shielding member. Even when the case apparatus is mounted on a mobile communication terminal, a near field communication between the mobile communication terminal and an external device is smoothly performed.

14 Claims, 4 Drawing Sheets

(56) References Cited

U.S. PATENT DOCUMENTS

| | | | |
|---|---|---|---|
| 8,849,195 B2* | 9/2014 | Orihara | H01Q 1/243 343/787 |
| 8,897,843 B2* | 11/2014 | Wong | 343/702 |
| 8,954,122 B2* | 2/2015 | Wilmhoff | H01Q 1/245 342/375 |
| 8,957,813 B2* | 2/2015 | McCaughey | H01Q 1/243 343/702 |
| 9,172,134 B2* | 10/2015 | McCaughey | H01Q 1/243 |
| 9,247,681 B2* | 1/2016 | Patino | H05K 9/0024 |
| 9,264,090 B2* | 2/2016 | Johnson | H04B 1/3888 |
| 2004/0041025 A1 | 3/2004 | Fukushima et al. | |
| 2004/0140896 A1 | 7/2004 | Ohkawa et al. | |
| 2005/0079820 A1 | 4/2005 | Yamashita | |
| 2005/0125093 A1 | 6/2005 | Kikuchi et al. | |
| 2006/0263647 A1 | 11/2006 | Moon et al. | |
| 2008/0297419 A1 | 12/2008 | Dou et al. | |
| 2009/0017882 A1 | 1/2009 | Kushima | |
| 2009/0160619 A1 | 6/2009 | Kato et al. | |
| 2010/0113111 A1 | 5/2010 | Wong et al. | |
| 2011/0163457 A1 | 7/2011 | Mohan et al. | |

FOREIGN PATENT DOCUMENTS

| | | |
|---|---|---|
| CN | 201038309 Y | 3/2008 |
| EP | 1439487 A2 | 7/2004 |
| JP | 3044966 U | 10/1997 |
| JP | 2000-137779 A | 5/2000 |
| JP | 2003-187195 A | 7/2003 |
| JP | 2003-249814 A | 9/2003 |
| JP | 2004-029873 A | 1/2004 |
| JP | 2004-343410 A | 12/2004 |
| JP | 2005-117354 A | 4/2005 |
| JP | 2006-157603 A | 6/2006 |
| JP | 2008-072243 A | 3/2008 |
| JP | 2008-537310 A | 9/2008 |
| JP | 2008-251283 A | 10/2008 |
| JP | 2008-306689 A | 12/2008 |
| KR | 10-2000-0063118 A | 11/2000 |
| KR | 10-2002-0064451 A | 8/2002 |
| KR | 10-0682539 B1 | 2/2007 |
| WO | WO-2008/050535 A1 | 5/2008 |
| WO | WO-2013/165421 A1 | 11/2013 |

OTHER PUBLICATIONS

Office Action dated Dec. 30, 2013 in Chinese Application No. 201080025421.
Office Action dated Jul. 2, 2013 in Japanese Application No. 2012-514879, filed Jun. 7, 2010.
European Search Report dated May 22, 2014 in European Application No. 10786332.6.
Office Action dated Mar. 3, 2015 in Japanese Application No. 2014-084919.
European Search Report dated Sep. 23, 2015 in European Application No. 15165428.2.
Office Action dated Nov. 22, 2016 in Chinese Application No. 201410705928.X.

* cited by examiner (a)

(b)

CASE APPARATUS

CROSS-REFERENCE TO RELATED APPLICATION

This application claims the benefit under 35 U.S.C. §119 of Korean Patent Application No. 10-2014-0051883, filed Apr. 29, 2014, which is hereby incorporated by reference in its entirety.

BACKGROUND

The present invention relates to a case apparatus, and more particularly, to a case apparatus mountable on a mobile communication terminal.

In general, various functions are added to a mobile communication terminal to provide various services. In this case, the mobile communication terminal has a near field communication function. In other words, the mobile communication terminal may access an external device to perform a near field communication. In this case, the mobile communication terminal performs the near field communication with the external device to provide a payment service or an authentication service. Meanwhile, the case apparatus which is mountable on the mobile communication terminal is realized. In this case, the case apparatus may be used to protect the mobile communication terminal or for improving the appearance.

However, the case apparatus may interfere with the near field communication between the mobile communication terminal and the external device. In other words, the case apparatus may block a signal transceived by the mobile communication terminal. Accordingly, the case apparatus may degrade the performance of the mobile communication terminal.

SUMMARY

Therefore, the present invention provides a case apparatus for preventing the performance of the mobile communication terminal from degrading. In addition, the present invention provides the case apparatus for relaying a signal transceived by the mobile communication terminal. Further, the present invention provides the case apparatus for relaying a near field communication between the mobile communication terminal and an external device.

To achieve the objects, the case apparatus according to the embodiment includes antenna elements, a shielding member interposed between the antenna elements and a protective part to encapsulate and couple the antenna elements and the shielding member.

In this case, in the case apparatus according to the embodiment, the shielding member may include multiple shielding sheets.

In addition, the case apparatus according to the embodiment may further include a correction member disposed between the shielding sheets.

Alternately, the case apparatus according to the embodiment may further include a battery disposed between the shielding sheets.

In addition, the case apparatus according to the embodiment may be mounted on and detached from the mobile communication terminal.

In this case, in the case apparatus according to the embodiment, the antenna elements may relay the short range communication between the mobile communication terminal and the external device.

In this case, in the case apparatus according to the embodiment, the short range communication may include NFC (Near Field Communication).

In addition, in the case apparatus according to the embodiment, the antenna elements include a first antenna element facing the mobile communication terminal to wirelessly communicate with the mobile communication terminal and a second antenna element disposed opposite the first antenna element while interposing the shielding member between the second antenna element and the first antenna element to wirelessly communicate with the external device.

The case apparatus is mountable on the mobile communication terminal to protect the mobile communication terminal and improve the appearance of the mobile communication terminal. In addition, the case apparatus may relay the near field communication between the mobile communication terminal and the external device. In other words, the case apparatus may relay the signal transceived by the mobile communication terminal. Accordingly, even when the case apparatus is mounted on the mobile communication terminal, the near field communication between the mobile communication terminal and the external device can be smoothly performed. Thus, the case apparatus can prevent the performance of the mobile communication terminal from degradation.

DETAILED DESCRIPTION OF THE EMBODIMENTS

Figure 1:
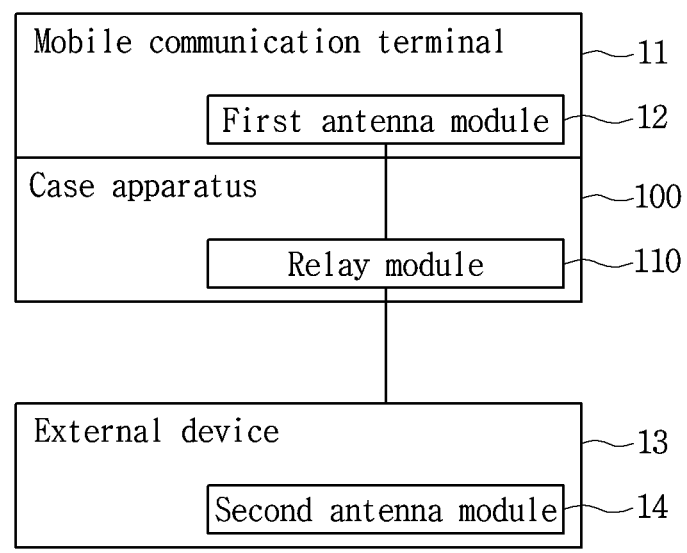
FIG. 1 is a block diagram showing a communication system employing the embodiment.

Hereinafter, embodiments of the disclosure will be more described with reference to accompanying drawings. In this case, it is noted that the same reference numerals are assigned to the same elements as much as possible. In addition, the details of well-known functions or configurations that may make the subject matter of the embodiments unclear will be omitted in the following description.

Figure 2:
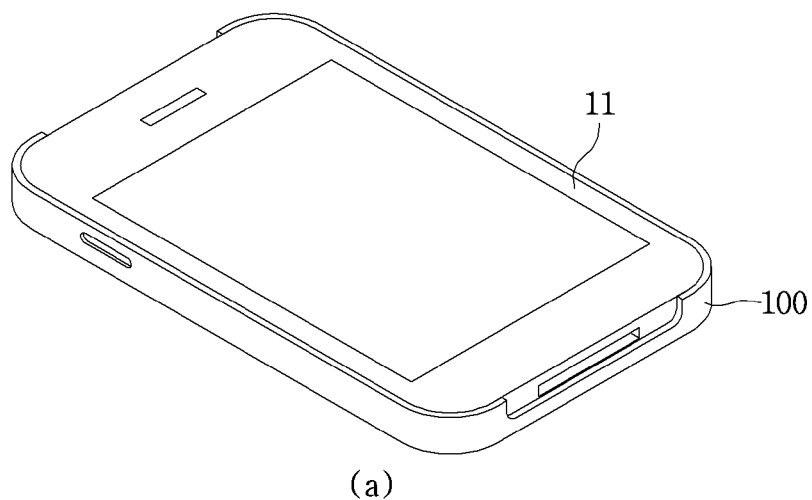
FIG. 2 is a perspective view showing an example of a case apparatus according to the embodiments.
Figure 2:
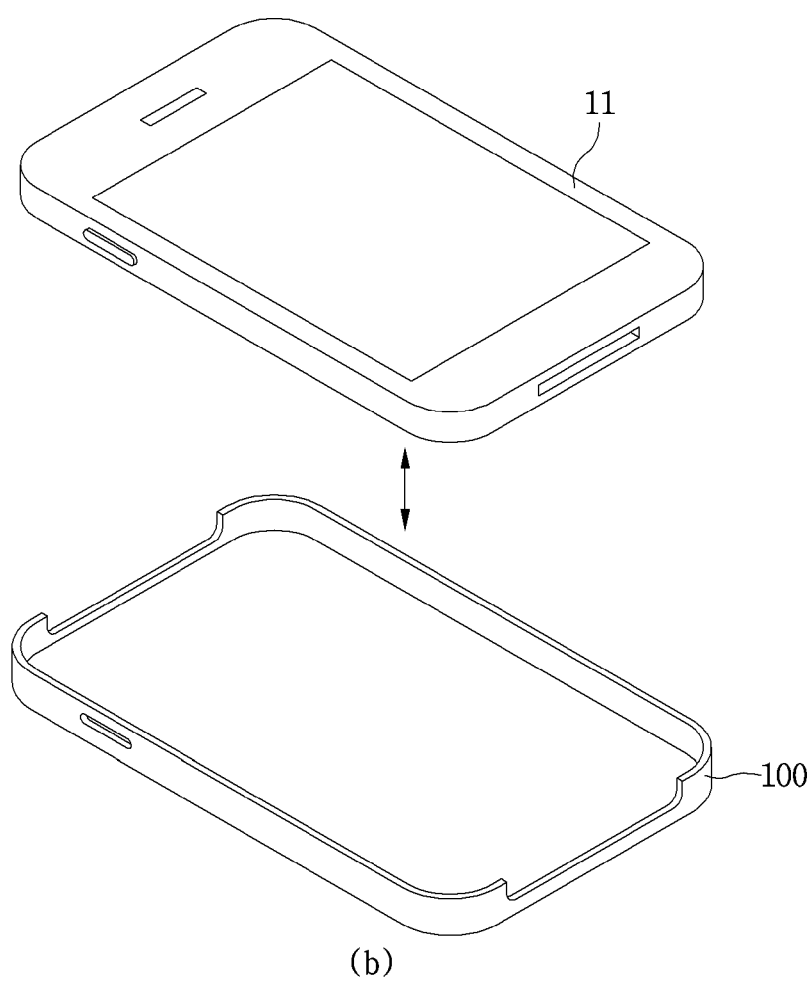

FIG. 1 is a block diagram showing a communication system employing the embodiment. In addition, FIG. 2 is a perspective view showing an example of a case apparatus according to the embodiments. In this case, FIG. 2 (*a*) shows the case apparatus mounted on a mobile communication terminal, and FIG. 2 (*b*) shows the case apparatus detached from the mobile communication terminal.

Referring to FIGS. 1 to 2, the communication system 10 employing the embodiment includes a mobile communication terminal 11, an external device 13, and a case apparatus 100.

The mobile communication terminal 11 and the external device 13 may perform a near field communication. That is, since the mobile communication terminal 11 accesses the external device 13, the mobile communication terminal 11 and the external device may perform the near field communication. In this case, the near field communication may include NFC (Near Field Communication). To this end, the mobile communication terminal 11 may include a first antenna module 12 and the external device 13 may include a second antenna module 14. Accordingly, when the mobile communication terminal 11 accesses the external device 13, the first antenna module 12 and the second antenna module 14 may perform the near field communication.

For example, the mobile communication terminal 11 may include a smart card, a portable phone, a smart phone, a netbook, a notebook, etc. In addition, the external device 13 may be various electronic devices including a reader.

The case apparatus 100 is mountable on the mobile communication terminal 11. In other words, the case apparatus 100 may be mounted to and detached from the mobile communication terminal 11. In this case, the case apparatus 100 may be mounted on the mobile communication terminal 11 to protect the mobile communication terminal 11 and improve the appearance of the mobile communication terminal 11.

In addition, the case apparatus 100 may be mounted on the mobile communication terminal 11 to relay the near field communication between the mobile communication terminal 11 and the external device 13. In other words, the case apparatus 100 may receive a signal from the mobile communication terminal 11 and transfer the signal to the external device 13. In addition, the case apparatus 100 may receive the signal from the external device 13 and transfer the signal to the mobile communication terminal 11. To this end, the case apparatus 100 may include a relay module 110. Accordingly, when the mobile communication terminal 11 accesses the external device 13, the relay module 110 may relay the near field communication between the first antenna module 12 and the second antenna module 14.

Figure 3:
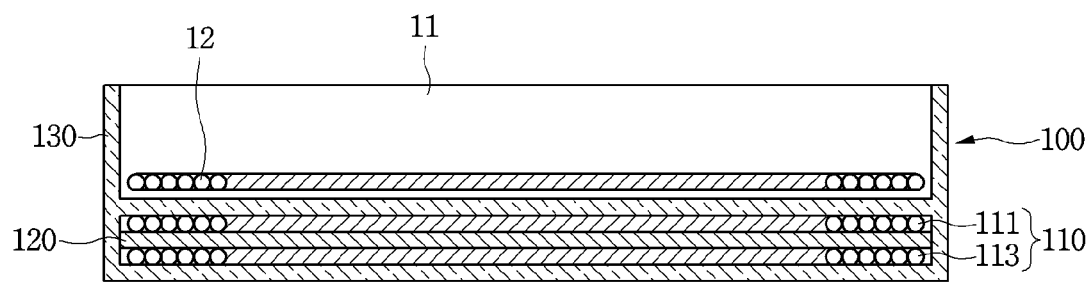
FIG. 3 is a sectional view showing the case apparatus according to the first embodiment.
Figure 4:
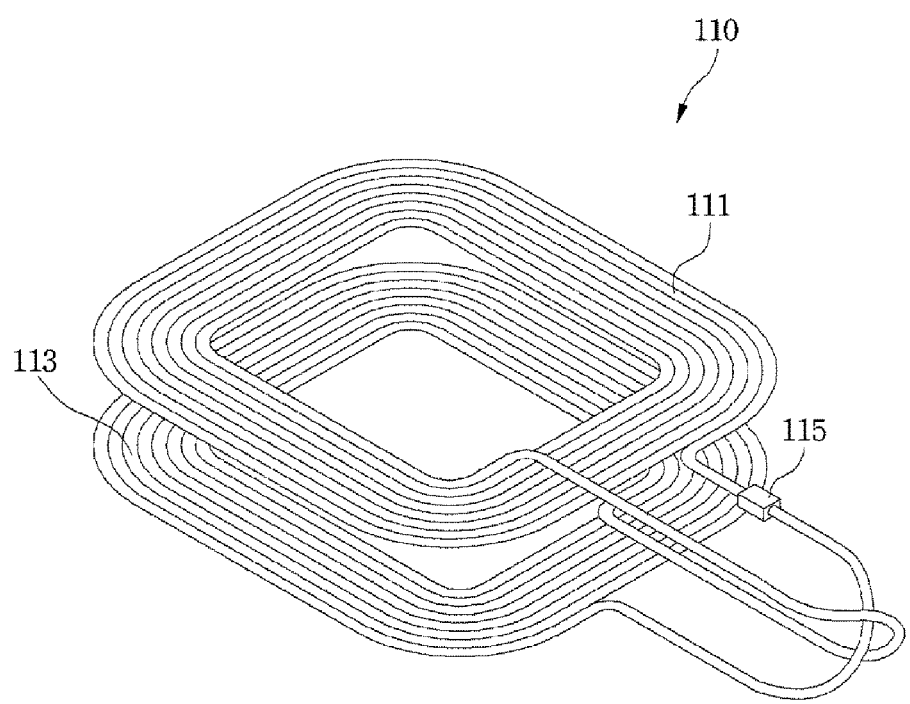
FIG. 4 is a perspective view showing a relay module of FIG. 3.

FIG. 3 is a sectional view showing a case apparatus according to the first embodiment. In addition, FIG. 4 is a perspective view showing a relay module of FIG. 3.

Referring to FIG. 3, the case apparatus 100 of the embodiment includes the relay module 110, a shielding member 120 and a protective part 130.

The relay module 110 relays the signal in the case apparatus 100. That is, the relay module 110 relays the near field communication between the mobile communication terminal 11 and the external device 13. In detail, the relay module 110 performs the near field communication with the mobile communication terminal 11, and performs the near field communication with the external device 13. In this case, the relay module 110 may receive a signal from the mobile communication terminal 11 and transfer the signal to the external device 13. In addition, the relay module 110 may receive the signal from the external device 13 and transfer the signal to the mobile communication terminal 11. In this case, the near field communication may include NFC (Near Field Communication).

The relay module 110 includes antenna elements 111 and 113. In detail, the relay module 110 includes first and second antenna elements 111 and 113. In this case, the first and second antenna elements 111 and 113 may be connected to each other. That is, the relay module 110 may be folded at the center thereof.

The first antenna element 111 faces the mobile communication terminal 11 in the case apparatus 100. In addition, the first antenna element 111 may perform the near field communication with the mobile communication terminal 11. That is, the antenna element 111 exchanges the signal with the mobile communication terminal 11. In this case, the first antenna element 111 receives the signal from the first antenna module 12 or transfers the signal to the first antenna module 12.

The first antenna 113 is disposed opposite the first antenna element 111 in the case apparatus 100. In addition, the second antenna element 113 may perform the near field communication with the external device 13. That is, the second antenna element 113 exchanges the signal with the external device 13. In this case, the second antenna element 113 receives the signal from the second antenna module 14 or transfers the signal to the second antenna module 14.

In this case, the first and second antenna elements 111 and 113 may be formed as shown in FIG. 4. That is, each of the first and second antenna elements 111 and 113 may include a coil. In this case, both ends of the first and second antenna elements 111 and 113 may be mutually connected. In addition, the first and second antenna elements 111 and 113 may form a loop. Selectively, any one of the first and second antenna elements 111 and 113 may further include a reactance element 115. In this case, the reactance element 115 may include an induction element and a capacitance element. For example, the induction element may include an inductor and the capacitance element may include a capacitor.

The shielding member 120 shields the antenna elements 111 and 113 in the case apparatus 100. In this case, the shielding member 120 is interposed between the antenna elements 111 and 113. In this case, the shielding member 120 may separate the antenna elements 111 and 113 from each other. In addition, the shielding member 120 may be formed in a single layer structure, or may be formed in a multi-layer structure. Accordingly, the second antenna element 113 is disposed opposite the first antenna element 111, with the shielding member 120 provided therebetween.

In this case, the shielding member 120 may be realized by a ferrite. In other words, the shielding member 120 may include metallic particles and a resin material. In this case, the metallic particles may include soft magnetic metallic particles, for example, metal silicon and iron oxide ((FeO; Fe3O4; Fe2O3). In addition, the resin material may include a thermoplastic resin, for example, polyolefin elastomer.

The protective part 130 is mountable on the mobile communication terminal 11 in the case apparatus 100. In other words, the protective part 130 may be mounted on and detached from the mobile communication terminal 11. In this case, the protective part 130 may adhere to the mobile communication terminal 11. In this case, the protective part 130 may extend toward a side surface of the mobile communication terminal 11, however not limited thereto. The protective part 130 may be formed by a plastic material.

In addition, the protective part 130 encapsulates the antenna elements 111 and 113 and the shielding member 120 in the case apparatus 100. In addition, the protective part 130 couples the antenna elements 111 and 113 and the shielding member 120 in the case apparatus 100. In this case, an accommodating space is formed in the protective part 130. In other words, the protective part 130 accommodates the antenna elements 111 and 113 and the shielding member 120 in the case apparatus 100.

According to the embodiment, the case apparatus 100 may be mounted on the mobile communication terminal 11 to protect the mobile communication terminal 11 and improve the appearance of the mobile communication terminal 11. In addition, a relay module 120 of the case apparatus may relay the near field communication between the mobile communication terminal 11 and the external device 13. In other words, the relay module may relay the signal transceived by the mobile communication terminal 11. Accordingly, even when the case apparatus 100 is mounted on the mobile communication terminal 11, the near field communication between the mobile communication terminal 11 and the external device 13 may be smoothly performed. Accordingly, the case apparatus 100 may prevent the performance of the mobile communication terminal 11 from degradation.

Figure 5:
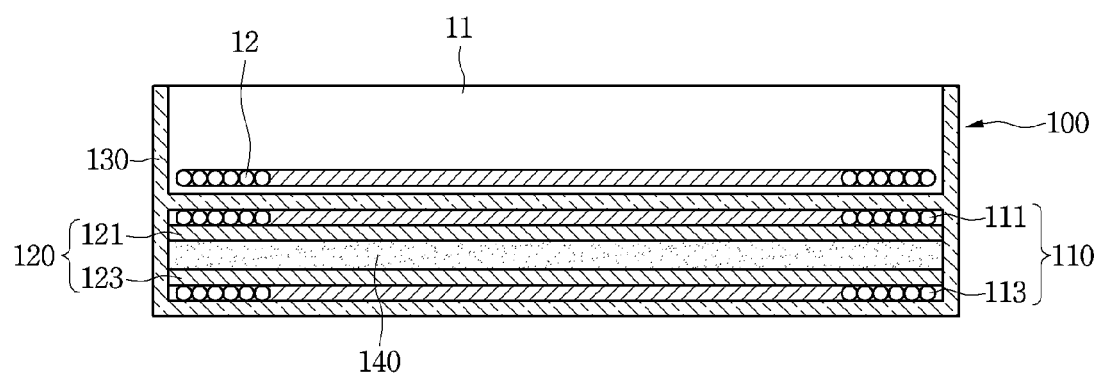
FIG. 5 is a sectional view showing a case apparatus according to the second embodiment.

FIG. 5 is a sectional view showing a case apparatus according to the second embodiment.

Referring to FIG. 5, the case apparatus 100 of the embodiment includes the relay module 110, the shielding member 120, the protective part 130 and a correction member 140. In the embodiment, the relay module 100, the shielding member 120 and the protective part 130 are identical to the described embodiment, so the description will be omitted.

In the embodiment, the shielding member 120 is formed in a multilayer structure. In other words, the shielding member 120 includes multiple shielding sheets 121 and 123. In detail, the shielding member 120 includes first and second shielding sheets 121 and 123. The first shielding sheet 121 is attached to the first antenna element 111. In addition, the second shielding sheet 123 is attached to the second antenna elements 113. In this case, the first and second shielding sheets 121 and 123 may be formed by similar materials. In this case, the first and second shielding sheets 121 and 123 may be connected to each other. That is, the shielding sheet 120 may be folded at the center thereof.

In addition, in the embodiment, the correction member 140 maintains the shape of the case apparatus 100. In this case, the correction member 140 is interposed between the shielding members 121 and 123. In this case, the correction member 140 may separate the shielding members 121 and 123 from each other. In other words, the correction member 140 may separate the antenna elements 111 and 113 from each other. In addition, the correction member 140 may be formed as a single layer structure, or may be formed as a multi-layer structure. Accordingly, the second shielding sheet 123 is disposed at an opposite side of the correction member 140 from the first antenna element 121. In other words, the second antenna element 113 is disposed opposite the first antenna element 111, with the correction member 140 provided therebetween.

According to the embodiment, the case apparatus 100 may be mounted on the mobile communication terminal 11 to protect the mobile communication terminal 11 and improve the appearance of the mobile communication terminal 11. In this case, the correction member 140 of the case apparatus 100 may more effectively protect the mobile communication terminal 11. In addition, a relay module 120 of the case apparatus may relay the near field communication between the mobile communication terminal 11 and the external device 13. In other words, the relay module may relay the signal transceived by the mobile communication terminal 11. Accordingly, even when the case apparatus 100 is mounted on the mobile communication terminal 11, the near field communication between the mobile communication terminal 11 and the external device 13 may be smoothly performed. Accordingly, the case apparatus 100 may prevent the performance of the mobile communication terminal 11 from degradation.

Figure 6:
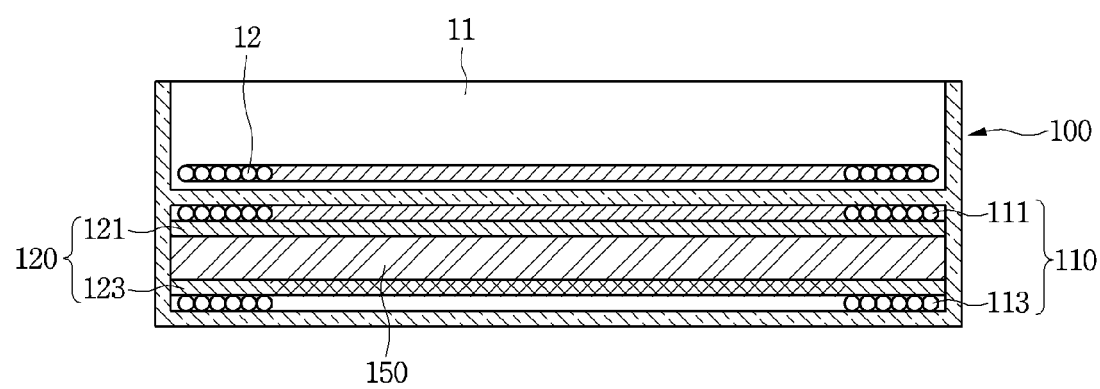
FIG. 6 is a sectional view showing a case apparatus according to the third embodiment.

FIG. 6 is a sectional view showing a case apparatus according to the third embodiment.

Referring to FIG. 6, the case apparatus 100 of the embodiment includes the relay module 110, the shielding member 120, the protective part 130 and a battery 150. In the embodiment, the relay module 100, since the shielding member 120 and the protective part 130 are identical to those of the described embodiment, the details thereof will be omitted.

In the embodiment, the battery 150 supplies power to the mobile communication terminal 11 in the case apparatus 100. In this case, the battery 150 includes an output terminal (not shown) and an input terminal (not shown). A connection terminal connects to the mobile communication terminal 11 to output power of the battery to the mobile communication terminal 11. The input terminal connects to an external power source to input power of the external power source to the battery 150. In this case, even though not shown, the connection terminal and the input terminal are externally exposed by the protective part 130.

In addition, the battery 150 maintains the shape of the case apparatus 100. In this case, the battery 150 is interposed between the shielding members 121 and 123. In this case, the battery 150 may separate the shielding members 121 and 123 from each other. In other words, the battery 150 may separate the antenna elements 111 and 113 from each other. Accordingly, the second shielding sheet 123 is disposed opposite the first antenna element 121, with the battery 150 provided therebetween. In other words, the second antenna element 113 is disposed opposite the first antenna element 111, with the battery 150 provided therebetween.

According to the embodiment, the case apparatus 100 may be mounted on the mobile communication terminal 11 to protect the mobile communication terminal 11 and improve the appearance of the mobile communication terminal 11. In addition, the battery 150 of the case apparatus 100 may more effectively supply power to the mobile communication terminal 11. Further, the relay module 120 of the case apparatus 100 may relay the near field communication between the mobile communication terminal 11 and the external device 13. In other words, the relay module may relay the signal transceived by the mobile communication terminal 11. Accordingly, even when the case apparatus 100 is mounted on the mobile communication terminal 11, the near field communication between the mobile communication terminal 11 and the external device 13 may be smoothly performed. Accordingly, the case apparatus 100 may prevent the performance of the mobile communication terminal 11 from degradation.

Meanwhile, it should be understood that the disclosure is not limited to the embodiments and may be embodied in different ways, and that the embodiments are given to provide complete disclosure and to provide thorough understanding to those skilled in the art. In other words, it will be understood by those of ordinary skill in the art that various substitutions, changes in form and alterations may be made therein without departing from the spirit and the scope of the disclosure.

What is claimed is:

1. A case apparatus comprising:
    a protective part having a receiving groove;
    a first antenna element disposed in the receiving groove and configured to wirelessly communicate with a mobile communication terminal;
    a second antenna element disposed in the receiving groove and configured to wirelessly communicate with an external device; and
    a shielding member interposed between the second antenna element and the first antenna element,
    wherein the second antenna element is disposed in opposition to the first antenna element,
    wherein the shielding member comprises a first shielding sheet and a second shielding sheet, wherein the case apparatus further comprises a correction member interposed between the first shielding sheet and the second shielding sheet, and
wherein the correction member separates the first shielding sheet and the second shielding sheet from each other.

2. The case apparatus of claim 1, further comprising a battery interposed between the first shielding sheet and the second shielding sheet.

3. The case apparatus of claim 1, wherein the protective part is detachably mounted on the mobile communication terminal.

4. The case apparatus of claim 3, wherein the first and second antenna elements are configured to relay short range communication between the mobile communication terminal and the external device.

5. The case apparatus of claim 4, wherein the short range communication comprises NFC (Near Field Communication).

6. The case apparatus of claim 1, wherein the first antenna element and the second antenna element are connected to each other.

7. The case apparatus of claim 1, wherein the first antenna element comprises a first coil; and
wherein the second antenna element comprises a second coil.

8. The case apparatus of claim 7, wherein at least one of the first and second antenna elements further comprises a reactance element connected to at least one of the first coil and the second coil.

9. The case apparatus of claim 8, wherein the reactance element comprises a capacitance element.

10. A case apparatus comprising:
a relay module;
a shielding member disposed within the relay module; and
a protective part encapsulating the relay module and the shielding member in a receiving groove such that the relay module is coupled to the shielding member,
wherein the relay module is folded at a center thereof,
wherein the relay module comprises:
a first antenna element disposed in the receiving groove, facing a mobile communication terminal and configured to wirelessly communicate with the mobile communication terminal; and
a second antenna element disposed in the receiving groove such that the shielding member is interposed between the second antenna element and the first antenna element, and configured to wirelessly communicate with an external device,
wherein the second antenna element is disposed in opposition to the first antenna element,
wherein the shielding member is folded at a center thereof,
wherein the first antenna element and the second antenna element comprise a coil,
wherein at least one of the first antenna element and the second antenna element further comprises a reactance element connected to the coil, and
wherein the reactance element comprises a capacitance element.

11. The case apparatus of claim 10, wherein the first antenna element and the second antenna element are connected to each other.

12. The case apparatus of claim 10, wherein the first antenna element comprises a first coil, and
wherein the second antenna element comprises a second coil.

13. The case apparatus of claim 12, wherein at least one of the first antenna element and the second antenna element further comprises a reactance element connected to at least one of the first coil and the second coil.

14. The case apparatus of claim 13, wherein the reactance element comprises a capacitance element.

* * * * *